(12) United States Patent
Yoshida et al.

(10) Patent No.: US 6,416,617 B2
(45) Date of Patent: Jul. 9, 2002

(54) APPARATUS AND METHOD FOR CHEMICAL/MECHANICAL POLISHING

(75) Inventors: Hideaki Yoshida, Osaka; Masashi Hamanaka, Nara, both of (JP)

(73) Assignee: Matsushita Electronics Corporation, Osaka (JP)

( * ) Notice: Subject to any disclaimer, the term of this patent is extended or adjusted under 35 U.S.C. 154(b) by 0 days.

(21) Appl. No.: 09/725,844

(22) Filed: Nov. 30, 2000

Related U.S. Application Data

(62) Division of application No. 09/145,126, filed on Sep. 1, 1998.

(30) Foreign Application Priority Data

Sep. 2, 1997 (JP) ............................... 9-236919

(51) Int. Cl.[7] .............................. B24B 49/00; B24B 5/00
(52) U.S. Cl. ...................................... 156/345.13; 451/55
(58) Field of Search ............................. 156/345; 451/51

(56) References Cited

U.S. PATENT DOCUMENTS

| 5,860,847 A | * | 1/1999 | Sakurai et al. | 451/10 |
| 5,876,265 A | * | 3/1999 | Kojima | 451/10 |
| 5,904,608 A | * | 5/1999 | Shaffer et al. | 379/220 |
| 5,904,609 A | * | 5/1999 | Fukuroda et al. | 451/8 |
| 5,938,502 A | | 8/1999 | Kubo | |
| 5,957,751 A | | 9/1999 | Govzman et al. | |
| 6,231,425 B1 | * | 5/2001 | Inaba et al. | 451/5 |

FOREIGN PATENT DOCUMENTS

| JP | 09070751 | 3/1997 |
| JP | 09070753 | 3/1997 |
| JP | 09139367 | 5/1997 |
| JP | 10217102 | 8/1998 |
| JP | 10315124 | 12/1998 |

* cited by examiner

*Primary Examiner*—Gregory Mills
*Assistant Examiner*—Sylvia R. MacArthur
(74) *Attorney, Agent, or Firm*—McDermott, Will & Emery

(57) ABSTRACT

A polishing pad is fixed on a polishing platen mounted to be rotatable. An abrasive supply tube supplies an abrasive onto the polishing pad. A substrate holder is mounted to be rotatable above the polishing pad, holds a substrate to be polished and presses the substrate against the polishing pad, thereby polishing the substrate. A dresser is mounted to be rotatable above the polishing pad, and dresses the polishing pad. A torque detector detects the rotation torque of the polishing platen or the rotation torque of the substrate holder. A dresser controller makes the dresser dress the polishing pad if the rotation torque detected by the torque detector is equal to or smaller than a predetermined value.

4 Claims, 13 Drawing Sheets

APPARATUS AND METHOD FOR CHEMICAL/MECHANICAL POLISHING

This application is a Divisional of application Ser. No. 09/145,126 filed Sep. 1, 1998.

BACKGROUND OF THE INVENTION

The present invention relates to apparatus and method for chemical/mechanical polishing for planarizing the surface of a film, such as a conductor film or an insulator film, deposited on a semiconductor substrate in multilevel interconnect and/or element isolation processes of a semiconductor integrated circuit.

Chemical/mechanical polishing (CMP) enables global planarization of a substrate, which cannot be accomplished by any other planarization technique such as resist etchback. Thus, CMP is one of most noticeable planarization techniques suitably employed for fabricating a semiconductor integrated circuit being miniaturized day by day. In addition, by performing CMP, various problems, such as inaccurate exposure resulting from the variation in depths of focus during a lithography process and inferior reliability of wires formed on a non-planarized surface, can be solved.

A conventional chemical/mechanical polishing apparatus (hereinafter, simply referred to as a "CMP polisher") will be described with reference to FIG. 10. FIG. 10 is a schematic representation illustrating an arrangement for a conventional CMP polisher.

As shown in FIG. 10, a substrate 1 to be polished, made of silicon or the like, is held by a substrate holder 2, which is rotatable and vertically movable. A polishing pad 3 for polishing the surface of the substrate 1 is attached to the planar surface of a polishing platen 4 for moving rotationally. An abrasive (in a slurry state) 5 is supplied through an abrasive supply tube 6 every time by a predetermined amount and dripped onto the polishing pad 3.

In the CMP polisher having such an arrangement, when the polishing platen 4 is rotated with the abrasive 5 dripped through the abrasive supply tube 6 onto the polishing pad 3, the polishing pad 3 is also rotated correspondingly. And when the substrate holder 2 is brought down while rotating, then the substrate 1, held by the substrate holder 2, comes into contact with the polishing pad 3. As a result, the surface of the substrate 1 is polished. The CMP polisher shown in FIG. 10 includes a single substrate holder 2. Accordingly, the polisher is of the type polishing a single substrate 1 during a single polishing process step. Alternatively, if a CMP polisher having a plurality of substrate holders 2 is used, then a plurality of substrates 1 can be polished in parallel with each other during a single polishing process step.

However, if polishing is performed by getting a large number of substrates 1 into contact with the polishing pad 3 one after another, then the polishing surface of the polishing pad 3 gradually loses its capacity to hold the abrasive 5. This is because as polishing is performed for a longer and longer time, the polishing surface of the polishing pad 3 gets more and more clogged owing to the deposition of polishing debris, the mass of abrasive particles and the like. As a result, the amount of the abrasive 5, held in a polishing region where the polishing pad 3 and the substrate 1 are in contact with each other, decreases, and consequently the number of abrasive particles contained in the abrasive 5 also decreases. Accordingly, a rate at which the substrate 1 is polished (hereinafter, simply referred to as a "polishing rate") adversely decreases.

Thus, it is necessary to re-increase and stabilize the polishing rate by rejuvenating the clogged polishing pad 3 through dressing. "Dressing" is a process step for recovering the polishing pad's 3 capacity to hold the abrasive 5 by eliminating clogging from the polishing pad 3. Clogging can be eliminated, for example, by rotating and pressing a dresser 7, to which fine particles of diamond or the like are embedded, against the polishing pad 3. If dressing is performed at regular intervals, then the polishing rate for a substrate can be increased and the variation in polishing rates among substrates can be reduced.

In general, the dressing process step is performed every time a number of substrates have been polished over a predetermined amount of time or every time the number of substrates polished has reached a predetermined number. Also, the dressing process step is performed either in parallel with the polishing process step of a substrate or in an interval between the polishing process steps of substrates.

The amount and number of abrasive particles, which exist on a polishing pad and contributing to polishing, are variable depending upon the roughness of the polishing surface of the polishing pad. Accordingly, the polishing rate of a substrate is also considerably affected by the variation in roughness of the polishing surface of the polishing pad. Thus, in order to keep a polishing rate constant, the roughness of the polishing surface of the polishing pad is desirably kept constant.

However, no method has heretofore been suggested for sensing the roughness of the polishing surface of a polishing pad. Accordingly, as described above, dressing is performed every time a number of substrates have been polished over a predetermined amount of time or every time the number of substrates polished has reached a predetermined number.

Since the roughness of the polishing surface of a polishing pad cannot be kept constant, various inconveniences are very likely to occur in the case of sequentially polishing a large number of substrates. For instance, the polishing rates are gradually decreased or varied among the substrates because the polishing pad gets clogged. Also, since the surface of the polishing pad is glazed, trouble tends to happen in transporting a substrate being held on a substrate holder. Specifically, it becomes less easy to take away the substrate from the polishing pad.

SUMMARY OF THE INVENTION

In view of the above-described problems, the present invention was made to reduce the variation in polishing rates among substrates by sensing the roughness of the polishing surface of a polishing pad and by adaptively dressing the polishing pad in accordance with the roughness sensed.

The present inventors supposed that the roughness of the polishing surface of a polishing pad might be sensed based on the rotation torque of a polishing platen on which the polishing pad is fixed. Based on this supposition, we examined the relationship between the polishing rate of a substrate and the rotation torque of a polishing platen from various angles. Herein, the rotation torque of a polishing platen is moment of force about the rotation axis of the polishing platen. Assume the position vector at a point about the rotation axis to be r and the vector of rotational driving force starting from the point to be A. Then, the rotation torque T is given by the vector product of r and A, that is to say, T=r×A.

In chemical/mechanical polishing, the magnitude of the position vector r is constant, while the magnitude of the rotational driving force vector A is proportional to the frictional force between a polishing pad and a substrate. And the direction of the rotational driving force vector A is aligned with the direction of rotation of the polishing platen, i.e., the rotation direction of the polishing pad. Thus, the rotation torque of the polishing platen is proportional not only to the magnitude of the rotational driving force vector A but also to the frictional force between the polishing pad and the substrate. Accordingly, if the rotation torque of the polishing platen is monitored, then the frictional force between the polishing pad and the substrate and therefore the roughness of the polishing surface of the polishing pad can be sensed nondestructively and instantaneously.

FIG. 11 illustrates the waveform of a signal obtained by quantifying the rotation torque (i.e., a rotation torque signal waveform) of a polishing platen during the polishing process step of a single substrate. In this example, dressing is performed on a polishing pad just before the polishing process step of the substrate is started. As can be understood from FIG. 11, immediately after polishing is started, large rotation torque is obtained thanks to the effect of dressing on the polishing pad. As polishing is performed for a longer and longer time, the effect of dressing attenuates. As a result, the rotation torque decreases to a certain magnitude. However, if an abrasive is continuously supplied, a sufficient amount of abrasive (i.e., a sufficient number of abrasive particles) continuously exists on the polishing surface of the polishing pad. Consequently, rotation torque of constant magnitude is maintained. The rotation torque is a vector and thus has a direction. In FIG. 11, the rotation torque signal waveform is located on the negative domain. This is because the direction of rotation of the polishing platen is clockwise with respect to that of the polishing pad. The direction of rotation torque has nothing to do with the frictional force between the polishing pad and the substrate. It is the absolute value of rotation torque that does have something to with the frictional force. Accordingly, in this specification, the magnitude of rotation torque is represented by the absolute value thereof.

FIG. 12 illustrates the rotation torque signal waveforms of a polishing platen where a plurality of substrates are sequentially polished one after another and where dressing is performed on the polishing pad just before polishing of a substrate is started. As shown in FIG. 12, the rotation torque signal waveforms of the polishing platen for respective substrates have amplitudes gradually decreasing as the continuous polishing process for the substrates proceeds. In other words, as the continuous polishing process is performed for a longer and longer time, the rotation torque gradually decreases. The rotation torque decreases partly because the number of abrasive particles contributing to polishing decreases as the polishing surface of the polishing pad gets more and more clogged.

FIG. 13 illustrates the relationship between the number of substrates processed and a polishing rate. Herein, the polishing rate means a decrease in thickness of a film in a predetermined amount of time. As can be understood from FIG. 13, as the continuous polishing process advances, the polishing rate decreases. The decrease in polishing rates corresponds to the decrease in amplitudes of the rotation torque signal waveforms shown in FIG. 12. In polishing a large number of substrates one after another, the polishing surface of the polishing pad gets more and more clogged as the polishing process advances. As a result, the rotation torque decreases, and the polishing rate also decreases correspondingly.

The present invention was made from these points of view. Specifically, the present invention is embodied in the apparatus and method for chemical/mechanical polishing summarized below.

A first chemical/mechanical polishing apparatus according to the present invention includes: a polishing platen mounted to be rotatable; a polishing pad fixed on the polishing platen; abrasive supply means for supplying an abrasive onto the polishing pad; a substrate holder, mounted to be rotatable above the polishing pad, for holding a substrate to be polished and pressing and polishing the substrate against the polishing pad; a dresser, mounted to be rotatable above the polishing pad, for dressing the polishing pad; torque detection means for detecting at least one of the rotation torque of the polishing platen and the rotation torque of the substrate holder; and dresser control means for making the dresser dress the polishing pad if the rotation torque detected by the torque detection means is equal to or smaller than a predetermined value.

In the first chemical/mechanical polishing apparatus, when clogging is generated in the polishing surface of the polishing pad after a certain number of substrates have been polished one after another, the rotation torque detected by the torque detection means becomes a predetermined value or less because of the decrease in frictional force between the substrate and the polishing pad. Then, the dresser control means drives the dresser to dress the polishing pad. As a result, clogging can be eliminated from the polishing surface of the polishing pad and the amount of the abrasive interposed between the substrate and the polishing pad can be increased. Accordingly, it is possible to prevent the polishing rate from decreasing and to eliminate the variation in polishing rates among the substrates.

A second chemical/mechanical polishing apparatus according to the present invention includes: a polishing platen mounted to be rotatable; a polishing pad fixed on the polishing platen; abrasive supply means for supplying an abrasive onto the polishing pad; a substrate holder, mounted to be rotatable above the polishing pad, for holding a substrate to be polished and pressing and polishing the substrate against the polishing pad; a dresser, mounted to be rotatable above the polishing pad, for dressing the polishing pad; torque detection means for detecting at least one of the rotation torque of the polishing platen, the rotation torque of the substrate holder and the rotation torque of the dresser; and dresser control means for increasing at least one of processing parameters including revolving speed of the dresser, pressure of the dresser against the polishing pad and amount of time during which the dresser dresses the polishing pad if the rotation torque detected by the torque detection means is smaller than a predetermined value.

In the second chemical/mechanical polishing apparatus, when clogging is generated in the polishing surface of the polishing pad after a certain number of substrates have been polished one after another, the rotation torque detected by the torque detection means becomes smaller than a predetermined value because of the decrease in frictional force between the substrate and the polishing pad. Then, the dresser control means increases at least one of the processing parameters including: revolving speed of the dresser; pressure of the dresser against the polishing pad; and amount of time during which the dresser dresses the polishing pad. As a result, clogging can be eliminated from the polishing surface of the polishing pad and the amount of the abrasive interposed between the substrate and the polishing pad can be increased. Accordingly, it is possible to prevent the polishing rate from decreasing and to eliminate the variation in polishing rates among the substrates.

The first or second chemical/mechanical polishing apparatus preferably further includes polishing control means for obtaining a rotation torque integrated value by integrating the rotation torque detected by the torque detection means with respect to time, and for stopping the operation of pressing and polishing the substrate, held by the substrate holder, against the polishing pad when the rotation torque integrated value reaches a prescribed value.

In such an embodiment, the variation in polishing amounts among the substrates can be reduced because a rotation torque integrated value corresponds to a polishing amount of a substrate. As a result, polishing can be performed just as originally designed.

A first chemical/mechanical polishing method according to the present invention includes the steps of: a) rotating a substrate holder, which holds a substrate thereon, with an abrasive supplied onto a polishing pad fixed on a rotating polishing platen, bringing the substrate down to be closer to the polishing pad, and then pressing the substrate against the polishing pad, thereby polishing the substrate; b) detecting at least one of the rotation torque of the polishing platen and the rotation torque of the substrate holder; and c) dressing the polishing pad if the rotation torque detected in the step b) is equal to or smaller than a predetermined value.

In the first chemical/mechanical polishing method, when clogging is generated in the polishing surface of the polishing pad after a certain number of substrates have been polished one after another, the rotation torque detected in the step b) becomes a predetermined value or less because of the decrease in frictional force between the substrate and the polishing pad. Then, the polishing pad is dressed. As a result, clogging can be eliminated from the polishing surface of the polishing pad and the amount of the abrasive interposed between the substrate and the polishing pad can be increased. Accordingly, it is possible to prevent the polishing rate from decreasing and to eliminate the variation in polishing rates among the substrates.

A second chemical/mechanical polishing method according to the present invention includes the steps of: a) rotating a substrate holder, which holds a substrate thereon, with an abrasive supplied onto a polishing pad fixed on a rotating polishing platen, bringing the substrate down to be closer to the polishing pad, and then pressing the substrate against the polishing pad, thereby polishing the substrate; b) dressing the polishing pad by pressing a rotating dresser against the polishing pad; c) detecting at least one of the rotation torque of the polishing platen, the rotation torque of the substrate holder and the rotation torque of the dresser; and d) increasing at least one of processing parameters including revolving speed of the dresser, pressure of the dresser against the polishing pad and amount of time during which the dresser dresses the polishing pad if the rotation torque detected in the step c) is smaller than a predetermined value.

In the second chemical/mechanical polishing method, when clogging is generated in the polishing surface of the polishing pad after a certain number of substrates have been polished one after another, the rotation torque detected in the step c) becomes smaller than a predetermined value because of the decrease in frictional force between the substrate and the polishing pad. Then, at least one of the processing parameters consisting of: revolving speed of the dresser; pressure of the dresser against the polishing pad; and amount of time during which the dresser dresses the polishing pad is increased. As a result, clogging can be eliminated from the polishing surface of the polishing pad and the amount of the abrasive interposed between the substrate and the polishing pad can be increased. Accordingly, it is possible to prevent the polishing rate from decreasing and to eliminate the variation in polishing rates among the substrates.

The first or second chemical/mechanical polishing method preferably further includes the step of obtaining a rotation torque integrated value by integrating the rotation torque detected in the step c) with respect to time, and stopping the operation of polishing the substrate in the step a) when the rotation torque integrated value reaches a prescribed value.

In such an embodiment, the variation in polishing amounts among the substrates can be reduced because a rotation torque integrated value corresponds to a polishing amount of a substrate. As a result, polishing can be performed just as originally designed.

In the second chemical/mechanical polishing method, if the rotation torque detected in the step c) is substantially equal to the predetermined value, the processing parameters are preferably not changed in the step d).

In such an embodiment, the process can swiftly proceed to dressing on the polishing pad.

In the second chemical/mechanical polishing method, the step d) preferably includes the step of further increasing the increased processing parameter if the rotation torque detected in the step c) is still smaller than the predetermined value after the processing parameter has been increased.

In such an embodiment, even if the polishing surface of the polishing pad gets clogged again after polishing on the substrates has further advanced, the polishing surface of the polishing pad can recover its initial state. Accordingly, it is possible to prevent the variation in polishing rates among the substrates.

DETAILED DESCRIPTION OF THE INVENTION

EMBODIMENT 1

Hereinafter, CMP polisher and method in the first embodiment of the present invention will be described with reference to FIGS. 1 and 2.

Figure 1:
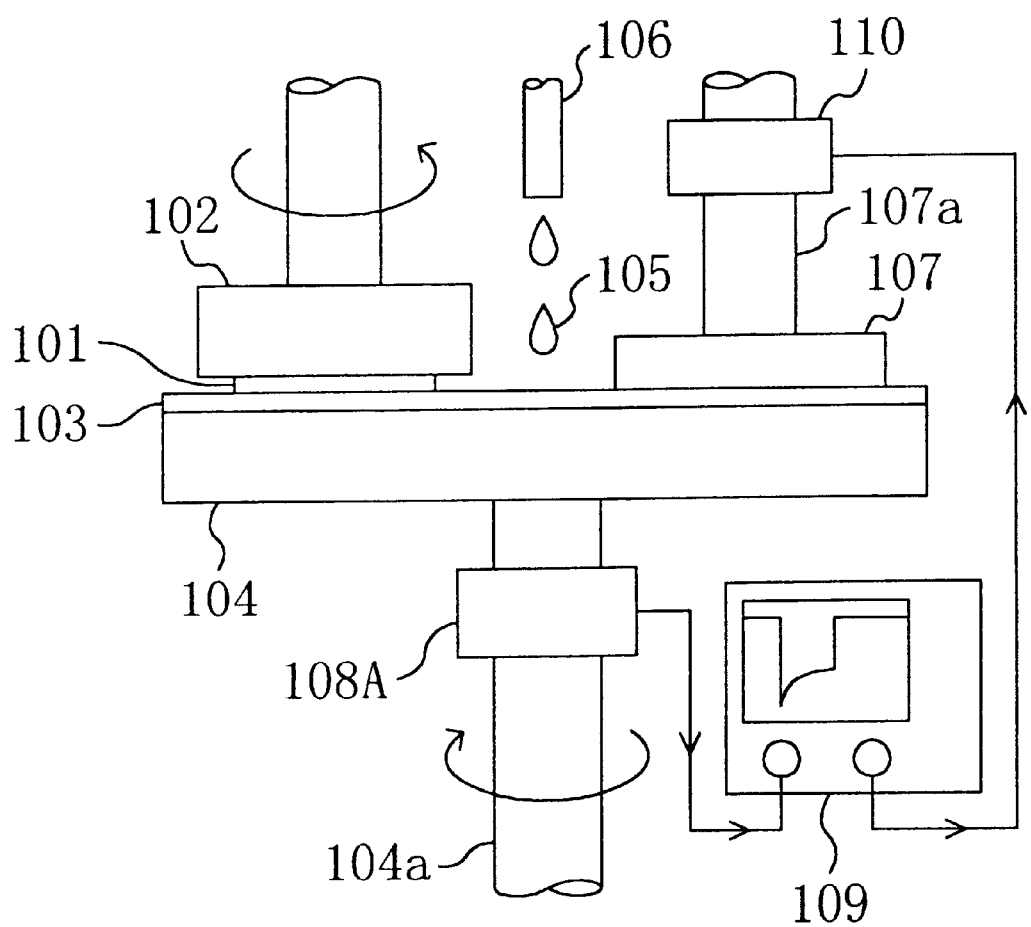
FIG. 1 is a schematic representation illustrating an overall arrangement for a CMP polisher in the first embodiment of the present invention.

FIG. 1 illustrates an overall arrangement for the CMP polisher of the first embodiment. As shown in FIG. 1, a substrate 101 to be polished, made of silicon or the like, is held by a substrate holder 102, which is mounted to be rotatable and vertically movable. A film to be polished, such as a silicon dioxide film, is deposited on the surface of the substrate 101. A polishing pad 103 for polishing the film to be polished on the substrate 101 is attached to the planar surface of a polishing platen 104 for moving rotationally. An abrasive (in a slurry state) 105 is supplied through an abrasive supply tube 106 every time by a predetermined amount and dripped onto the polishing pad 103.

In the CMP polisher of the first embodiment, when the polishing platen 104 is rotated with the abrasive 105 dripped through the abrasive supply tube 106 onto the polishing pad 103, the polishing pad 103 is also rotated correspondingly. And when the substrate holder 102 is brought down while rotating, the film to be polished on the substrate 101, held by the substrate holder 102, comes into contact with the polishing pad 103. As a result, the film on the substrate 101 is polished.

Above the polishing pad 103, a dresser 107 is mounted to be rotatable and vertically movable. The dresser 107 comes into contact with the polishing surface of the polishing pad 103, thereby roughening the polishing surface of the polishing pad 103 that has got clogged because of the attachment of polishing debris and/or abrasive particles contained in the abrasive. In this manner, the polishing surface of the polishing pad 103 regains its capacity to hold the abrasive.

The first embodiment is characterized in that a torque detector 108A for detecting the rotation torque of a rotation axis 104a of the polishing platen 104 is secured to the rotation axis 104a. The torque detector 108A continuously detects the rotation torque of the rotation axis 104a of the polishing platen 104 and outputs the detected rotation torque as a rotation torque signal.

The rotation torque signal output from the torque detector 108A is provided to a torque monitor 109. The torque monitor 109 quantifies the rotation torque signal received, stores the quantified rotation torque signal as a measured torque value, and compares the measured torque value stored to a reference torque value stored beforehand (predetermined value). If the measured torque value is equal to or smaller than the reference torque value, then the torque monitor 109 outputs a torque variation signal. Since the rotation torque detected by the torque detector 108A represents the roughness of the polishing surface of the polishing pad 103, the measured torque value quantified by the torque monitor 109 represents the quantified roughness of the polishing surface of the polishing pad 103. For example, if the measured torque value is equal to or smaller than the reference torque value, then the polishing surface of the polishing pad 103 has got clogged because of the attachment of polishing debris and/or the mass of abrasive particles thereto. In other words, it means that the clogging state of the polishing surface of the polishing pad 103 has exceeded a predetermined criterion.

A dresser controller 110 for controlling the rotation motion and vertical motion of the dresser 107 is secured to the rotation axis 107a of the dresser 107. On receiving the torque variation signal as an input from the torque monitor 109, the dresser controller 110 sets the processing parameters including revolving speed of the dresser 107, pressure of the dresser 107 against the polishing pad 103, and time of contact between the dresser 107 and the polishing pad 103, thereby making the dresser 107 dress the polishing pad 103.

Hereinafter, it will be specifically described how the dresser controller 110 controls the dresser 107.

For example, in polishing twenty-five substrates per lot one after another, when the polishing pad 103 gets clogged, the torque monitor 109 determines that the measured torque value became equal to or smaller than the reference torque value during polishing of a substrate, e.g., a fifth substrate, and outputs a torque variation signal. In response to the torque variation signal received, the dresser controller 110 sets revolving speed of the dresser 107, pressure of the dresser 107 against the polishing pad 103, and time of contact between the dresser 107 and the polishing pad 103 at a time when polishing of the substrate in question is finished, thereby making the dresser 107 dress the polishing pad 103. After dressing on the polishing pad 103 has been completed and clogging has been eliminated from the polishing pad 103, polishing is continuously performed on another remaining substrate, e.g., a sixth substrate, included in one lot. By repeatedly performing such a process step, polishing is performed on the remaining substrates included in one lot by the polishing pad 103, from which clogging has been eliminated through dressing, i.e., the polishing pad 103 that has recovered its initial state. Thus, the variation in polishing rates among all these substrates included in one lot can be reduced.

In the first embodiment, the dresser controller 110 controls and instructs the dresser 107 to perform dressing at a point in time when polishing on a current substrate is completed. Alternatively, dressing may be performed in parallel within a time interval during which polishing on the current substrate is being performed.

Figure 2:
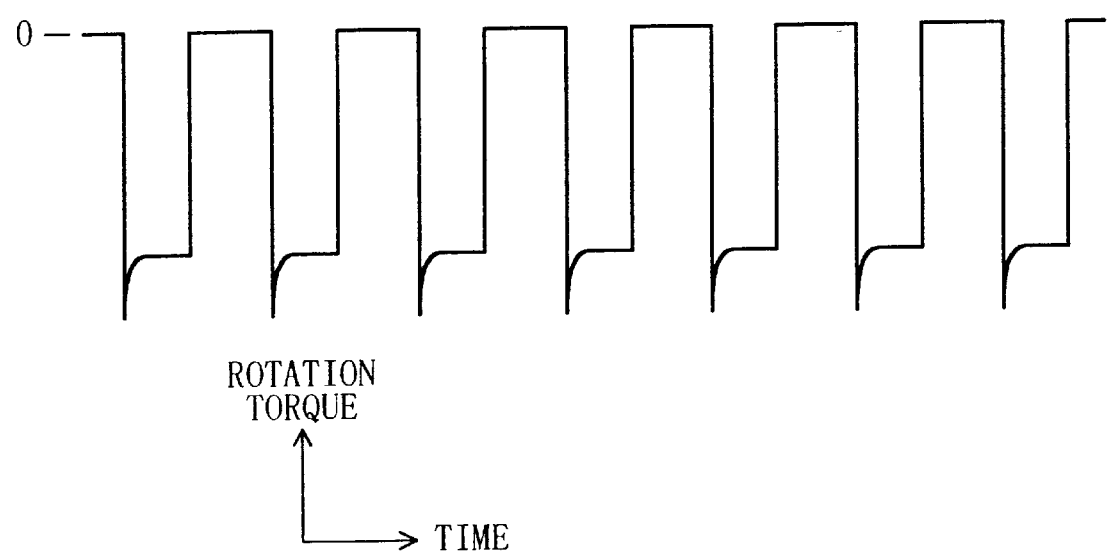
FIG. 2 is a waveform chart representing the rotation torque waveforms of a polishing platen where a plurality of substrates are polished one after another in a CMP method of the first embodiment.

FIG. 2 illustrates the rotation torque waveforms, detected by the torque detector 108A for the rotation axis 104a of the polishing platen 104, where a plurality of substrates have been polished one after another in accordance with the CMP method of the first embodiment. As can be understood from FIG. 2, since the rotation torque waveforms of the substrates polished one after another have stabilized amplitudes and shapes, the polishing rates for the respective substrates are also kept constant.

In the first embodiment, the torque monitor 109 quantifies the rotation torque signal for the rotation axis 104a of the polishing platen 104, which signal has been output from the torque detector 108A, as a measured torque value. If the measured torque value becomes equal to or smaller than the reference torque value, the torque monitor 109 outputs a torque variation signal. On receiving the torque variation signal from the torque monitor 109, the dresser controller 110 makes the dresser 107 dress the polishing pad 103. That is to say, when the polishing surface of the polishing pad 103 gets clogged, the polishing pad 103 is dressed by the dresser 107. Accordingly, the roughness of the polishing surface of the polishing pad 103 is maintained substantially constant. Thus, the variation in polishing rates among the substrates can be reduced and therefore polishing can be performed just as originally designed by polishing each substrate for the same amount of time. As a result, the yield of a chemical/mechanical polishing process on substrates can be increased.

EMBODIMENT 2

Hereinafter, CMP polisher and method in the second embodiment of the present invention will be described with reference to FIG. 3.

Figure 3:
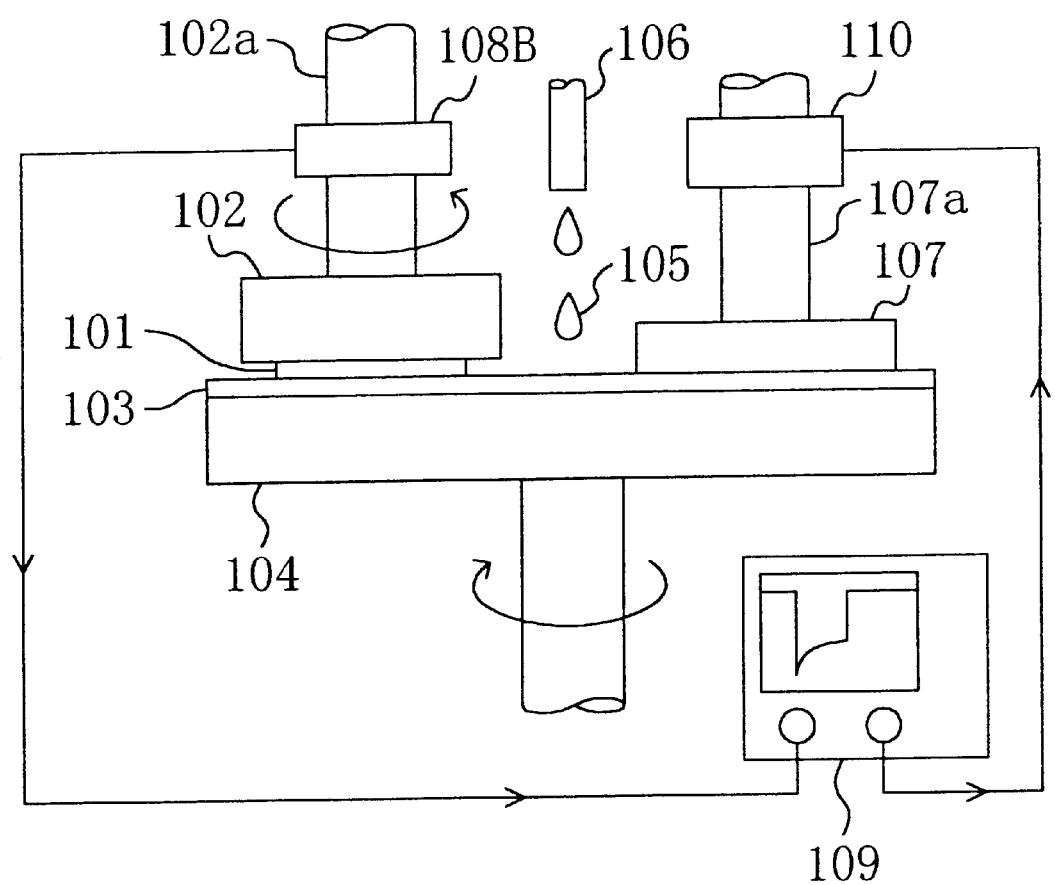
FIG. 3 is a schematic representation illustrating an overall arrangement for a CMP polisher in the second embodiment of the present invention.

FIG. 3 illustrates an overall arrangement for the CMP polisher of the second embodiment. In this embodiment, the same members as those of the first embodiment shown in FIG. 1 will be identified by the same reference numerals and the description thereof will be omitted herein.

The second embodiment is characterized in that a torque detector 108B for detecting the rotation torque of the rotation axis 102a of the substrate holder 102 is secured to the rotation axis 102a. The torque detector 108B continuously detects the rotation torque of the rotation axis 102a of the substrate holder 102 and outputs the detected rotation torque as a rotation torque signal. The rotation torque signal output from the torque detector 108B is provided to a torque monitor 109 as in the first embodiment. If the measured torque value becomes equal to or smaller than the reference torque value, then the torque monitor 109 outputs a torque variation signal. On receiving the torque variation signal as an input from the torque monitor 109, the dresser controller 110 sets revolving speed of the dresser 107, pressure of the dresser 107 against the polishing pad 103, and time of contact between the dresser 107 and the polishing pad 103, thereby making the dresser 107 dress the polishing pad 103.

Since the rotation torque detected by the torque detector 108B represents the roughness of the polishing surface of the polishing pad 103, the measured torque value quantified by the torque monitor 109 represents the quantified roughness of the polishing surface of the polishing pad 103.

In the second embodiment, the torque monitor 109 quantifies the rotation torque signal for the rotation axis 102a of the substrate holder 102, which signal has been output from the torque detector 108B, as a measured torque value. When the measured torque value becomes equal to or smaller than the reference torque value, the torque monitor 109 outputs a torque variation signal. On receiving the torque variation signal as an input from the torque monitor 109, the dresser controller 110 makes the dresser 107 dress the polishing pad 103. That is to say, when the polishing surface of the polishing pad 103 gets clogged, the polishing surface of the polishing pad 103 is dressed by the dresser 107. Accordingly, the roughness of the polishing surface of the polishing pad 103 is maintained substantially constant. Thus, the variation in polishing rates among the substrates can be reduced and polishing can be performed just as originally designed. As a result, the yield of a chemical/mechanical polishing process on substrates can be increased.

In the second embodiment, the dresser controller 110 controls and instructs the dresser 107 to perform dressing at a point in time when polishing on a current substrate is completed. Alternatively, dressing may be performed in parallel within a time interval during which polishing is being performed on the current substrate.

In the second embodiment, a single substrate holder 102 is provided. Alternatively, a plurality of substrate holders 102 may be provided and a plurality of torque detectors 108B, each detecting the rotation torque of the rotation axis 102a of an associated one of the substrate holders 102, may be secured to the rotation axes 102a. In such a case, the rotation torque signals output from the respective torque detectors 108B are input to the torque monitor 109. In response thereto, the torque monitor 109 quantifies the rotation torque signals, which have been output from the respective torque detectors 108B for the rotation axes 102a of the respective substrate holders 102, as measured torque values, calculates an average of the measured torque values and outputs a torque variation signal when the average of the measured torque values becomes smaller than the reference torque value.

In such an embodiment, in a batch-type CMP polisher for polishing a plurality of substrates simultaneously, the variation in polishing rates among the substrates polished simultaneously can also be reduced.

EMBODIMENT 3

Hereinafter, CMP polisher and method in the third embodiment of the present invention will be described with reference to FIG. 4.

Figure 4:
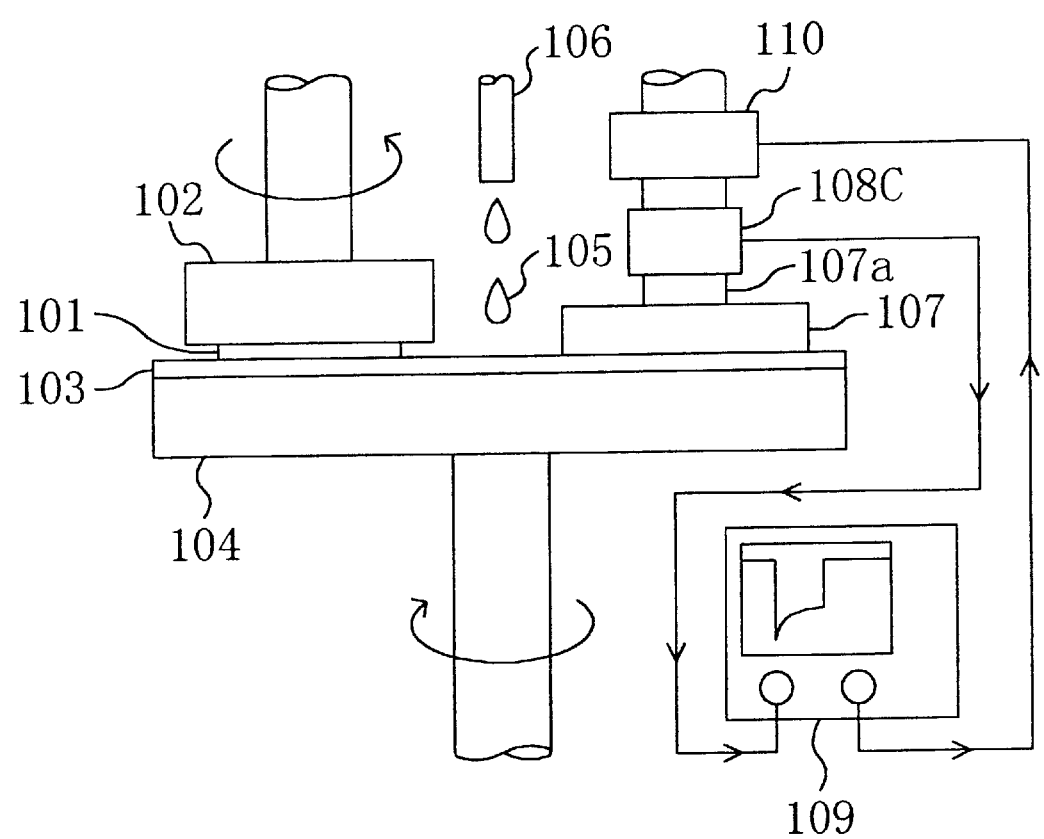
FIG. 4 is a schematic representation illustrating an overall arrangement for a CMP polisher in the third embodiment of the present invention.

FIG. 4 illustrates an overall arrangement for the CMP polisher of the third embodiment. In this embodiment, the same members as those of the first embodiment shown in FIG. 1 will be identified by the same reference numerals and the description thereof will be omitted herein. In the third embodiment, polishing on the substrate 101 and dressing by the dresser 107 on the polishing pad 103 are supposed to be performed simultaneously.

The third embodiment is characterized in that a torque detector 108C for detecting the rotation torque of the rotation axis 107a of the dresser 107 is secured to the rotation axis 107a. The torque detector 108C continuously detects the rotation torque of the rotation axis 107a of the dresser 107 and outputs the detected rotation torque as a rotation torque signal. The rotation torque signal output from the torque detector 108C is provided to a torque monitor 109 as in the first embodiment. If the measured torque value becomes equal to or smaller than the reference torque value, then the torque monitor 109 outputs a torque variation signal. On receiving the torque variation signal as an input from the torque monitor 109, the dresser controller 110 increases at least one of the processing parameters including: revolving speed of the dresser 107; pressure of the dresser 107 against the polishing pad 103; and time of contact between the dresser 107 and the polishing pad 103, thereby intensifying dressing performed by the dresser 107 on the polishing pad 103.

Since the rotation torque detected by the torque detector 108C represents the roughness of the polishing surface of the polishing pad 103, the measured torque value quantified by the torque monitor 109 represents the quantified roughness of the polishing surface of the polishing pad 103.

In the third embodiment, the torque monitor 109 quantifies the rotation torque signal of the rotation axis 107a of the dresser 107, which signal has been output from the torque detector 108C, as a measured torque value. When the measured torque value becomes equal to or smaller than the reference torque value, the torque monitor 109 outputs a torque variation signal. On receiving the torque variation signal as an input from the torque monitor 109, the dresser controller 110 increases at least one of the processing parameters including: revolving speed of the dresser 107; pressure of the dresser 107 against the polishing pad 103; and time of contact between the dresser 107 and the polishing pad 103, thereby intensifying dressing performed by the dresser 107 on the polishing pad 103. That is to say, when the polishing surface of the polishing pad 103 gets clogged, the dressing performed by the dresser 107 is intensified. Accordingly, the roughness of the polishing surface of the polishing pad 103 is maintained substantially constant. Thus, the variation in polishing rates among the substrates can be reduced and polishing can be performed just as originally designed. As a result, the yield of a chemical/mechanical polishing process on substrates can be increased.

EMBODIMENT 4

Hereinafter, CMP polisher and method in the fourth embodiment of the present invention will be described with reference to FIGS. 5 and 6.

Figure 5:
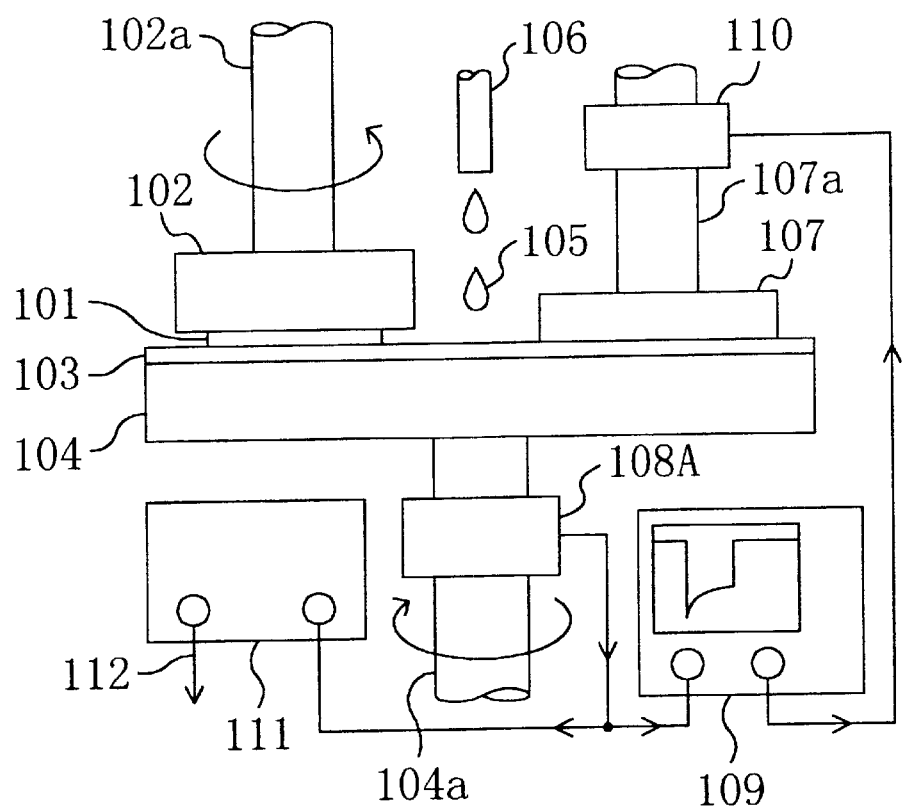
FIG. 5 is a schematic representation illustrating an overall arrangement for a CMP polisher in the fourth embodiment of the present invention.

FIG. 5 illustrates an overall arrangement for the CMP polisher of the fourth embodiment. In this embodiment, the same members as those of the first embodiment shown in FIG. 1 will be identified by the same reference numerals and the description thereof will be omitted herein.

In the fourth embodiment, the torque detector 108A for detecting the rotation torque of the rotation axis 104a of the polishing platen 104 is secured to the rotation axis 104a as in the first embodiment. The torque detector 108A continuously detects the rotation torque of the rotation axis 104a of the polishing platen 104 and outputs the detected rotation torque as a rotation torque signal.

The fourth embodiment is characterized in that the rotation torque signal output from the torque detector 108A is provided not only to the torque monitor 109, but also to a polishing controller 111. As in the first embodiment, if the measured torque value becomes equal to or smaller than the reference torque value, then the torque monitor 109 outputs a torque variation signal. On receiving the torque variation signal as an input from the torque monitor 109, the dresser controller 110 sets revolving speed of the dresser 107, pressure of the dresser 107 against the polishing pad 103, and time of contact between the dresser 107 and the polishing pad 103, thereby making the dresser 107 dress the polishing pad 103.

In polishing a plurality of substrates one after another, every time polishing is performed on each substrate, the polishing controller 111 quantifies the input rotation torque signals, integrates the quantified rotation torque values with respect to time, stores the integrated value as a rotation torque integrated value, and compares the stored rotation torque integrated value to a reference torque value (predetermined value) stored beforehand. When the rotation torque integrated value reaches the reference torque value, the polishing controller 111 outputs a polishing stop signal 112. The reference torque value stored beforehand is a value representing that a substrate has been polished by an amount originally designed.

The polishing stop signal 112 output from the polishing controller 111 is input to a driver for lifting the substrate holder 102. In response to the signal 112, the driver lifts the substrate holder 102. As a result, the substrate 101 held by the substrate holder 102 is taken away from the polishing pad 103 and therefore polishing on the substrate 101 is terminated.

In chemical/mechanical polishing, the larger the frictional force between the substrate 101 and the polishing pad 103 is, the larger the rotational driving force vector A is. As a result, the rotation torque T is also increased correspondingly. Therefore, the larger the amplitude of a rotation torque signal is, the larger the frictional force between the substrate 101 and the polishing pad 103 is. Thus, the polishing rate for the substrate 101 is also increased correspondingly. The integrated value obtained by integrating the quantified rotation torque values with respect to time represents the amount of material removed from the substrate 101 by polishing (hereinafter, such an amount will be referred to as a "polishing amount").

Figure 6:
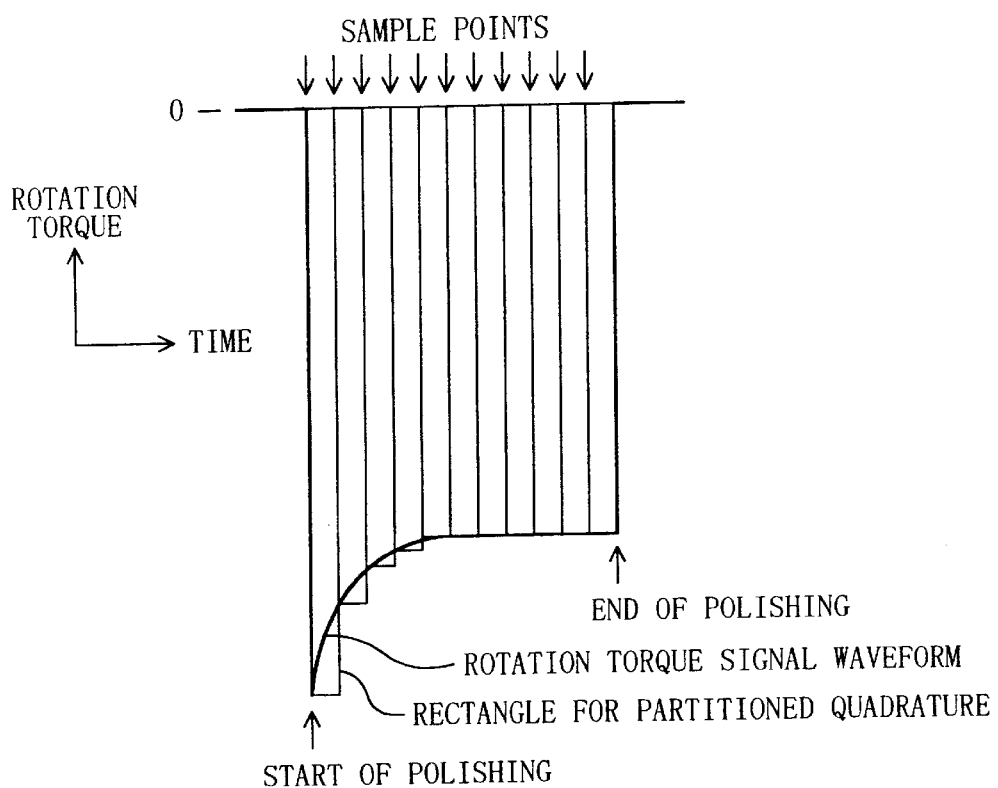
FIG. 6 is a chart for illustrating a method of integrating rotation torque values in a CMP method of the fourth embodiment.

FIG. 6 illustrates a method for integrating the rotation torque values quantified by the polishing controller 111. The polishing controller 111 quantifies the rotation torque signals supplied from the torque detector 108A, stores the quantified rotation torque values as sample values at predetermined intervals, and integrates the stored sample values, thereby obtaining a rotation torque integrated value. As shown in FIG. 6, the area of the rotation torque signal waveform is calculated as a total sum of the areas of a plurality of rectangles, each of which is defined by the predetermined interval and the rotation torque sample values for an associated sampling interval. This method is generally called a "partitioned quadrature".

In the fourth embodiment, in polishing a plurality of substrates one after another, when the area of the rotation torque signal waveform for each substrate, i.e., the rotation torque integrated value, reaches the reference torque value stored beforehand, the polishing controller 111 outputs the polishing stop signal 112, thereby terminating polishing on each substrate. Thus, since the variation in polishing amounts among the substrates can be reduced with more certainty, polishing can be performed just as originally designed.

In the fourth embodiment, the rotation torque of the polishing platen 104 is detected by the torque detector 108A secured to the rotation axis 104a of the polishing platen 104. Alternatively, the rotation torque of the substrate holder 102 may be detected by the torque detector 108B secured to the rotation axis 102a of the substrate holder 102 as in the second embodiment. Furthermore, the rotation torque of the dresser 107 may be detected by the torque detector 108C secured to the rotation axis 107a of the dresser 107 as in the third embodiment. It is noted that in detecting the rotation torque by the torque detector 108C secured to the rotation axis 107a of the dresser 107, polishing on the substrate 101 and dressing on the polishing pad 103 should be performed in parallel with each other.

EMBODIMENT 5

Hereinafter, a CMP method in the fifth embodiment of the present invention will be described with reference to FIGS. 1, 7 and 8. In the fifth embodiment, polishing on a substrate and dressing on the polishing pad are supposed to be performed alternately.

The time intervals during which dressing and polishing are respectively performed and the rotation torque during polishing will be described with reference to FIG. 7.

First, before polishing on substrates is started, the polishing platen 104 and the polishing pad 103 are rotated and the dresser 107 is brought down while rotating, thereby performing initial dressing $D_0$ on the polishing pad 103. If the initial dressing $D_0$ is performed in this way, clogging can be eliminated from the polishing surface of the polishing pad 103 before polishing on the substrates is started. Thus, the polishing pad 103 gets well ready for polishing on the substrates.

Next, after the dresser 107 has been lifted, a first slurry supply process step $S_1$ is started on the polishing pad 103. Thereafter, while the first slurry supply process step $S_1$ is continued, a first polishing process step $P_1$ is performed by pressing the substrate 101 held by the substrate holder 102 against the polishing pad 103 and at the same time, the first rotation torque $T_1$ of the polishing platen 104 is detected by the torque detector 108A. The first rotation torque $T_1$ is detected as rotation torque in the steady state when the waveform of rotation torque is flattened.

When the first polishing process step $P_1$ on the substrate is finished, a first rinsing process step $R_1$ is performed, thereby cleaning the polishing pad 103.

Next, a first dressing process step $D_1$ is performed on the polishing pad 103. In this case, since the polishing surface of the polishing pad 103 has got clogged only slightly as a result of the first polishing process step $P_1$, the time interval of the first dressing process step $D_1$ is set equal to that of the initial dressing process step $D_0$.

Then, while a second slurry supply process step $S_2$ is continued on the polishing pad 103, a second polishing process step $P_2$ is performed by pressing the substrate 101 against the polishing pad 103 and the second rotation torque $T_2$ of the polishing platen 104 is detected. The second rotation torque $T_2$ is also detected as rotation torque in the steady state. In this case, the value of the second rotation torque $T_2$ is smaller than that of first rotation torque $T_1$. This is because the frictional force between the substrate 101 and the polishing pad 103 has decreased since the polishing surface of the polishing pad 103 has got clogged as a result of the second polishing process step $P_2$. When the second polishing process step $P_2$ on the substrate is finished, a second rinsing process step $R_2$ is performed, thereby cleaning the polishing pad 103.

Subsequently, a second dressing process step $D_2$ is performed on the polishing pad 103. In this case, since the value of the second rotation torque $T_2$ is smaller than that of first rotation torque $T_1$, it can be seen that the polishing surface of the polishing pad 103 has got clogged as a result of the second polishing process step $P_2$. Thus, the time interval of the second dressing process step $D_2$ is set longer than that of the first dressing process step $D_1$ without changing the load applied to the substrate holder 102. As a result, clogging can be eliminated from the polishing surface of the polishing pad 103 and the polishing surface of the polishing pad 103 can recover its initial state.

Then, while a third slurry supply process step $S_3$ is continued on the polishing pad 103, a third polishing process step $P_3$ is performed by pressing the substrate 101 against the polishing pad 103 and the third rotation torque $T_3$ of the polishing platen 104 is detected. The third rotation torque $T_3$ is also detected as rotation torque in the steady state. In this case, since the polishing surface of the polishing pad 103 has recovered its initial state by extending the time interval of the second dressing process step $D_2$, the value of the third rotation torque $T_3$ is larger than that of second rotation torque $T_2$ and approximately equal to that of the first rotation torque $T_1$. When the third polishing process step $P_3$ on the substrate is finished, a third rinsing process step $R_3$ is performed, thereby cleaning the polishing pad 103.

Next, the rotation torque during polishing process steps and the processing time intervals of dressing process steps where a large number of substrates are polished one after another will be described with reference to FIG. 8.

Figure 7:
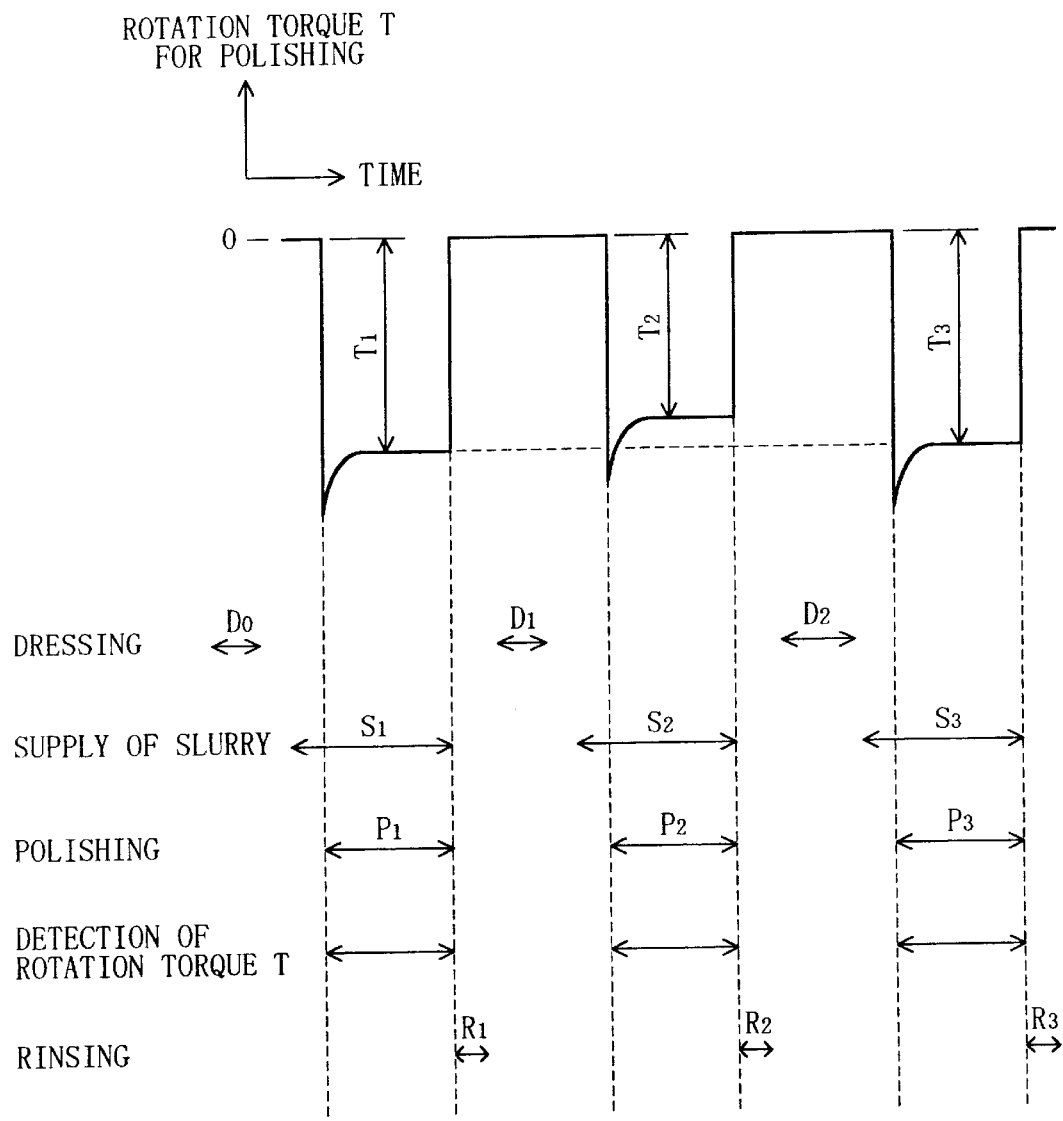
FIG. 7 is a chart illustrating the relationship among the respective time periods during which dressing and polishing process steps are performed and the rotation torque during polishing process steps in a CMP method in the fifth embodiment of the present invention.

First, as in the example illustrated in FIG. 7, initial dressing is performed by the dresser 107 on the polishing pad 103 on the processing conditions that the rotation torque is $T_{D0}$ and the processing time interval is $t_0$, thereby recovering the initial state for the polishing surface of the polishing pad 103. Thereafter, polishing is performed on the first substrate and the rotation torque $T_{P1}$ of the polishing platen 104 is measured. In the following description, the rotation torque $T_{P1}$ of the polishing platen 104 while the first substrate is being polished will be called "initial rotation torque $T_{P1}$". Then, post-polishing dressing for the first substrate is performed on the processing conditions that the rotation torque is $T_{D1}$ and the processing time interval is $t_1$. In this case, the rotation torque $T_{D1}$ is equal to the rotation torque $T_{D0}$ and the processing time interval $t_1$ is equal to the processing time interval $t_0$.

Next, polishing is performed on the second substrate and simultaneously the rotation torque $T_{P2}$ of the polishing platen 104 is measured. In this case, since the polishing pad 103 has got clogged, the rotation torque $T_{P2}$ for the second substrate is smaller than the initial rotation torque $T_{P1}$. Then, post-polishing dressing for the second substrate is performed on the processing conditions that the rotation torque is $T_{D2}$ and the processing time interval is $t_2$. In this case, the rotation torque $T_{P2}$ during the polishing process step of the second substrate is smaller than the initial rotation torque $T_{P1}$. Thus, in the dressing process step, the rotation torque $T_{D2}$ is set equal to the rotation torque $T_{D0}$ but the processing time interval $t_2$ is set longer than the processing time interval $t_1$, thereby recovering the initial state for the polishing surface of the polishing pad 103.

Subsequently, polishing is performed on the third substrate and simultaneously the rotation torque $T_{P3}$ of the polishing platen 104 is measured. In this case, since the polishing surface of the polishing pad 103 has recovered its initial state before the polishing process step on the third substrate is started, the rotation torque $T_{P3}$ for the third substrate is substantially equal to the initial rotation torque $T_{P1}$. Then, post-polishing dressing for the third substrate is performed on the processing conditions that the rotation torque is $T_{D3}$ and the processing time interval is $t_3$. In this case, the rotation torque $T_{P3}$ during the polishing process step of the third substrate is substantially equal to the initial rotation torque $T_{P1}$. Thus, in the dressing process step, the rotation torque $T_{D3}$ is set equal to the rotation torque $T_{D0}$ and the processing time interval $t_3$ is also set equal to the processing time interval $t_2$.

Thereafter, polishing on a substrate, measurement of the rotation torque of the polishing platen 104 and post-polishing dressing are repeatedly performed on the fourth substrate and so on. In the remaining process steps, if the rotation torque of the polishing platen 104 is substantially equal to the initial rotation torque $T_{P1}$, the processing time interval of the post-polishing dressing performed after that is set equal to the processing time interval of the previous dressing process step. On the other hand, if the rotation torque of the polishing platen 104 is smaller than the initial rotation torque $T_{P1}$, the processing time interval of the post-polishing dressing performed after that is set longer than that of the previous dressing process step, thereby recovering the initial state for the polishing surface of the polishing pad 103.

Figure 8:
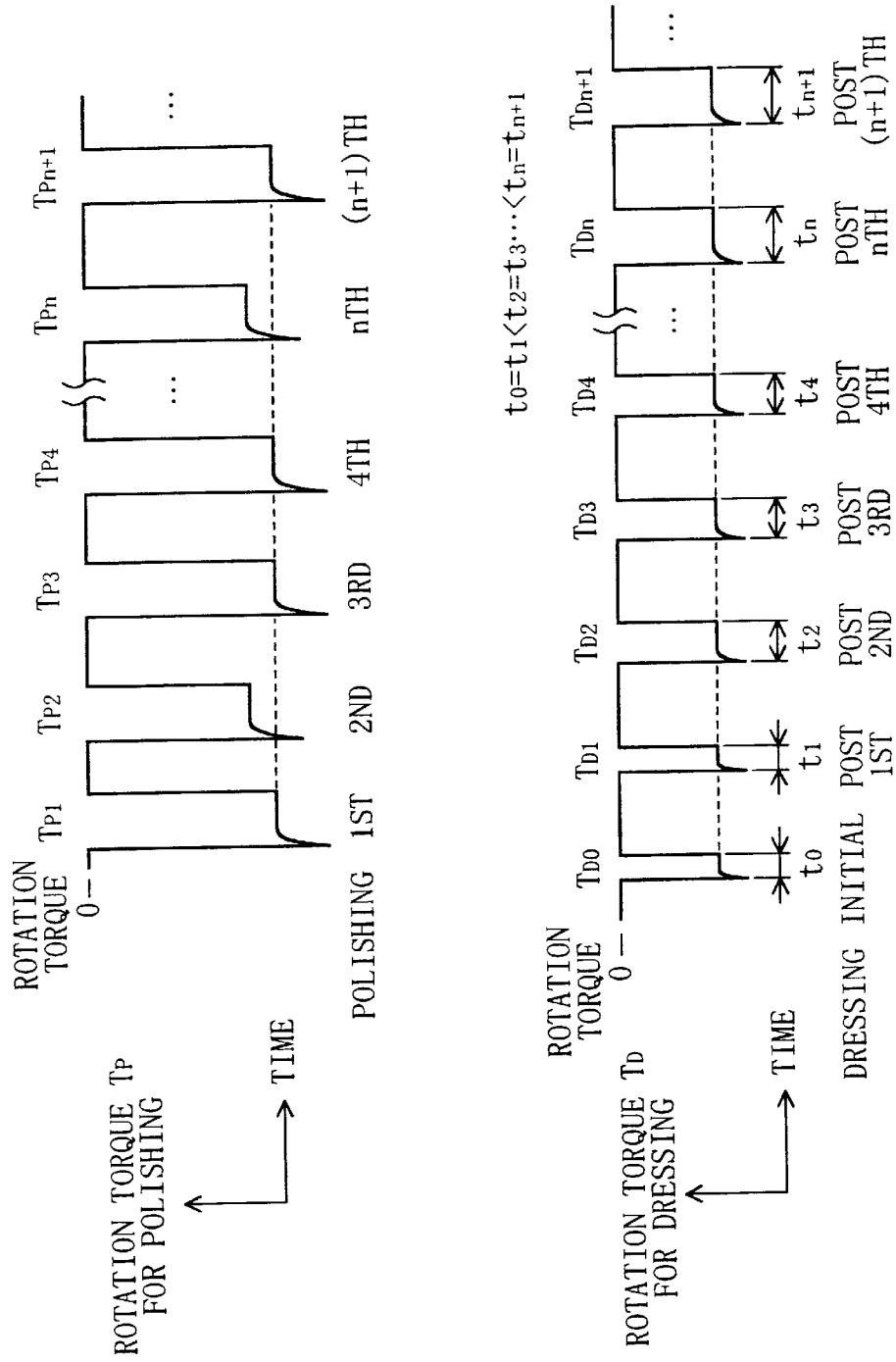
FIG. 8 is a chart illustrating the relationship between the rotation torque during polishing process steps and processing time intervals of dressing process steps in the CMP method of the fifth embodiment.

For example, as shown in FIG. 8, if the rotation torque $T_{P4}$ of the polishing platen 104 during the polishing process step on the fourth substrate is substantially equal to the initial rotation torque $T_{P1}$, the processing time interval $t_4$ of post-polishing dressing for the fourth substrate is set equal to the processing time interval $t_3$ of post-polishing dressing for the third substrate. In general, if the rotation torque $T_{Pn}$ of the polishing platen 104 during the polishing process step on the n-th substrate is smaller than the initial rotation torque $T_{P1}$, the processing time interval $t_n$ of post-polishing dressing for the n-th substrate is set longer than that of the previous dressing process step. And if the rotation torque $T_{Pn+1}$ of the polishing platen 104 during the polishing process step on the (n+1)th substrate is substantially equal to the initial rotation torque $T_{P1}$, the processing time interval $t_{n+1}$ of post-polishing dressing for the (n+1)th substrate is set equal to the processing time interval $t_n$ of post-polishing dressing for the nth substrate.

In the fifth embodiment, if the rotation torque of the polishing platen 104 during a polishing process step on a substrate is substantially equal to the initial rotation torque $T_{P1}$, the processing time interval of a dressing process step performed after that is set equal to that of the previous dressing process step. On the other hand, if the rotation torque of the polishing platen 104 is smaller than the initial rotation torque $T_{P1}$, it can be seen that the polishing surface of the polishing pad 103 has got clogged. Thus, the processing time interval of the dressing process step performed after that is set longer than that of the previous dressing process step without changing the load applied on the substrate holder 102 and the respective revolving speeds of the substrate holder 102 and the polishing platen 104, thereby recovering the initial state for the polishing surface of the polishing platen 104. Accordingly, the polishing rates among the substrates can be kept constant.

In the fifth embodiment, the processing conditions of dressing are set based on the rotation torque of the rotation axis 104a of the polishing platen 104. Alternatively, the processing conditions of dressing may be set based on the rotation torque of the rotation axis 102a of the substrate holder 102.

Also, in this embodiment, the processing conditions for dressing are changed by extending a processing time interval. Alternatively, the pressure against the dresser 107, the revolving speed of the dresser 107, the revolving speed of the polishing platen 104 or a combination thereof may also be increased.

EMBODIMENT 6

Next, a CMP method in the sixth embodiment of the present invention will be described with reference to FIGS. 1 and 9. In the sixth embodiment, polishing on a substrate and dressing on the polishing pad are supposed to be performed in parallel with each other.

Hereinafter, the relationship between rotation torque during a polishing process step and load (pressure) during a dressing process step where a large number of substrates are polished one after another will be described with reference to FIG. 9. It is noted that the processing time intervals are set constant in the sixth embodiment for the respective dressing process steps.

First, initial dressing is performed on the polishing pad 103 with the application of load $G_0$ to the dresser 107, thereby recovering the initial state for the polishing surface of the polishing pad 103. Thereafter, while the first polishing process step is being performed on a substrate, the rotation torque $T_{P1}$ of the polishing platen 104 is measured. And at the same time, the first dressing process step is performed on the polishing pad 103 with load $G_1$ applied on the dresser 107. The load $G_1$ for the first dressing process step is set equal to the load $G_0$ for initial dressing. It is noted that the rotation torque $T_{P1}$ of the polishing platen 104 during the first polishing process step will be called "initial rotation torque $T_{P1}$".

Then, while the second polishing process step is being performed on another substrate, the rotation torque $T_{P2}$ of the polishing platen 104 is measured. And at the same time, the second dressing process step is performed on the polishing pad 103 with load $G_2$ applied on the dresser 107. In this case, since the rotation torque during the first polishing process step is the initial rotation torque $T_{P1}$, the load $G_2$ for the second dressing process step is set equal to the load $G_1$ for the first dressing process step. On the other hand, the rotation torque $T_{P2}$ during the second polishing process step is smaller than the initial rotation torque $T_{P1}$.

Subsequently, while the third polishing process step is being performed on another substrate, the rotation torque $T_{P3}$ of the polishing platen 104 is measured. And at the same time, the third dressing process step is performed on the polishing pad 103 with load $G_3$ applied on the dresser 107. In this case, since the rotation torque $T_{P2}$ during the second polishing process step is smaller than the initial rotation torque $T_{P1}$, the load $G_3$ for the third dressing process step is set larger than the load $G_2$ for the second dressing process step by $\Delta G$, thereby recovering the initial state for the polishing surface of the polishing pad 103.

Thereafter, while the fourth polishing process step is being performed on another substrate, the rotation torque $T_{P4}$ of the polishing platen 104 is measured. And at the same time, the fourth dressing process step is performed on the polishing pad 103 with load $G_4$ applied on the dresser 107. In this case, since the rotation torque $T_{P3}$ during the third polishing process step is substantially equal to the initial rotation torque $T_{P1}$, the load $G_4$ for the fourth dressing process step is set equal to the load $G_3$ for the third dressing process step. Since the polishing surface of the polishing pad 103 has recovered its initial state by setting the load $G_3$ for the third dressing process step larger than the load $G_2$ for the second dressing process step, the rotation torque $T_{P4}$ during the fourth polishing process step is substantially equal to the initial rotation torque $T_{P1}$ Thereafter, the rotation torque of the polishing platen 104 is repeatedly measured while performing the fifth polishing process step and so on for remaining substrates. And at the same time, dressing is also repeatedly performed with load applied on the dresser 107. In general, if the rotation torque of the polishing platen 104 is substantially equal to the initial rotation torque $T_{P1}$, the load for the next dressing process step is set equal to the load for the current dressing process step. On the other hand, if the rotation torque of the polishing platen 104 is smaller than the initial rotation torque $T_{P1}$, the load for the next dressing process step is set larger than the load for the current dressing process step, thereby recovering the initial state for the polishing surface of the polishing pad 103.

Figure 9:
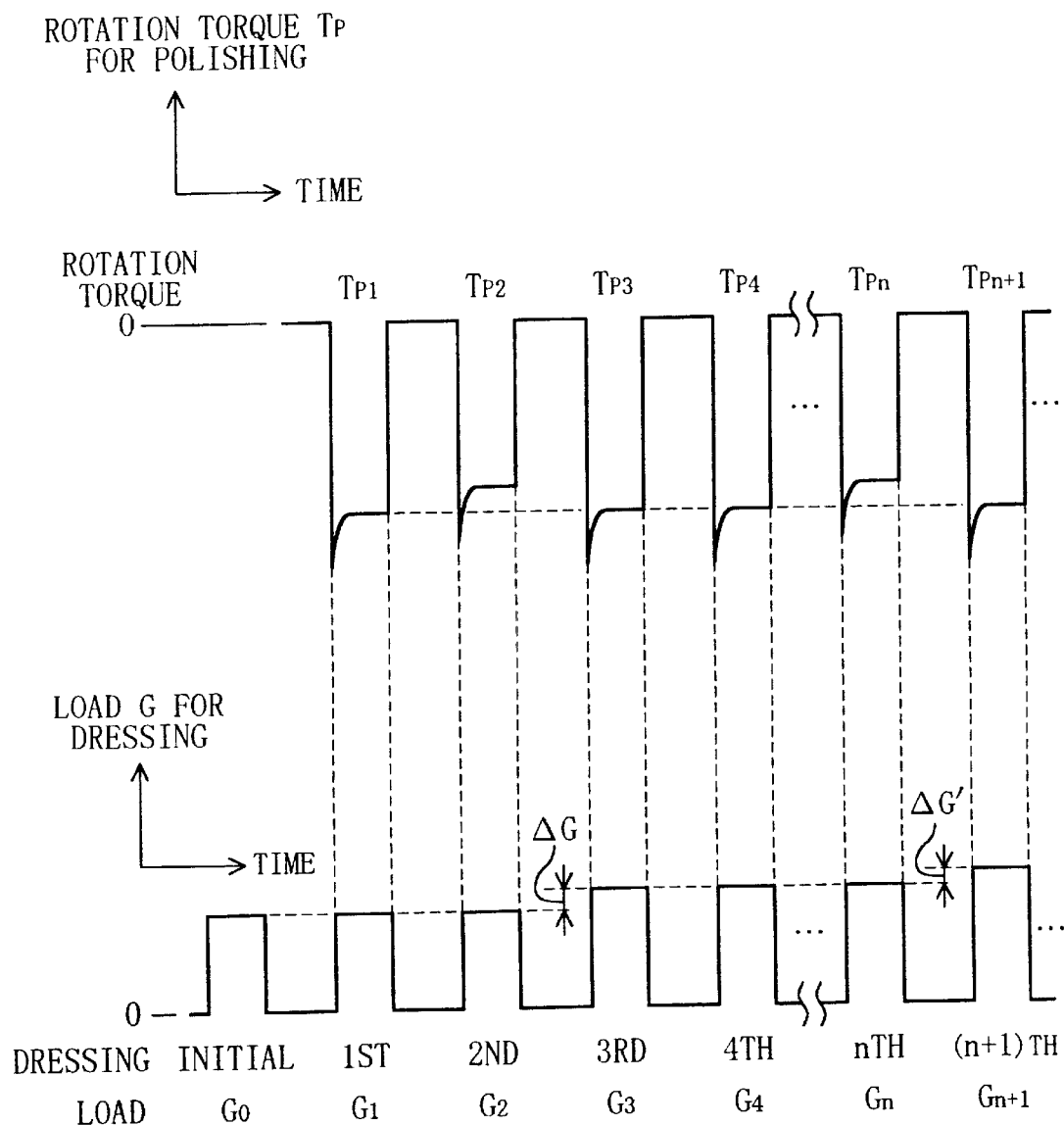
FIG. 9 is a chart illustrating the relationship between the rotation torque during polishing process steps and the loads applied in dressing process steps in a CMP method in the sixth embodiment of the present invention.
Figure 10:
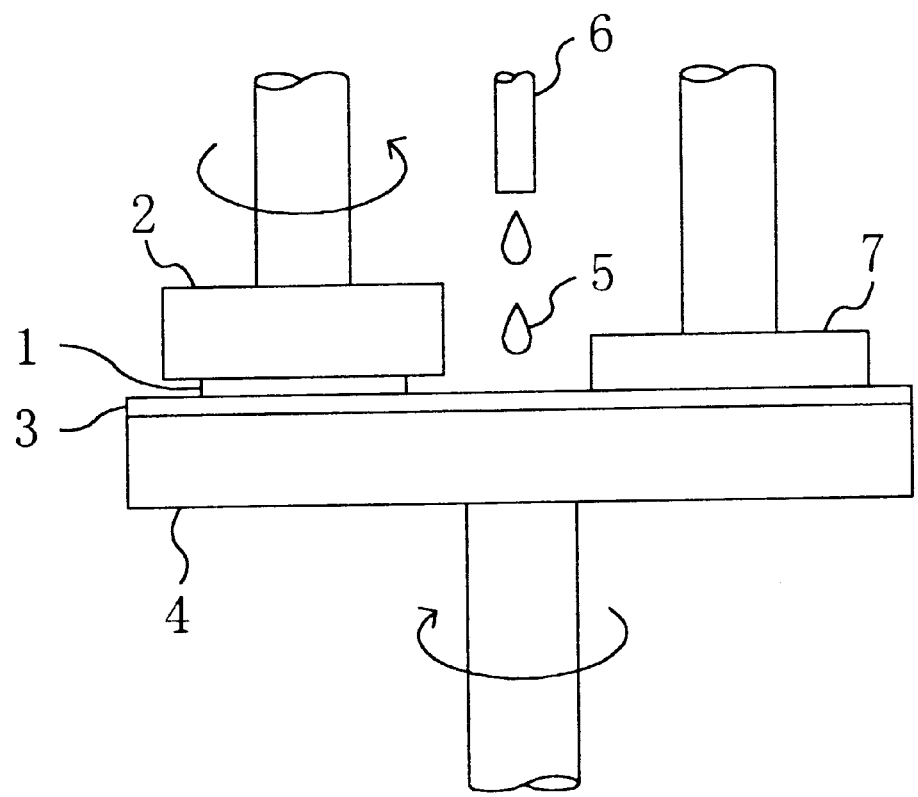
FIG. 10 is a schematic representation of a conventional CMP polisher.
Figure 11:
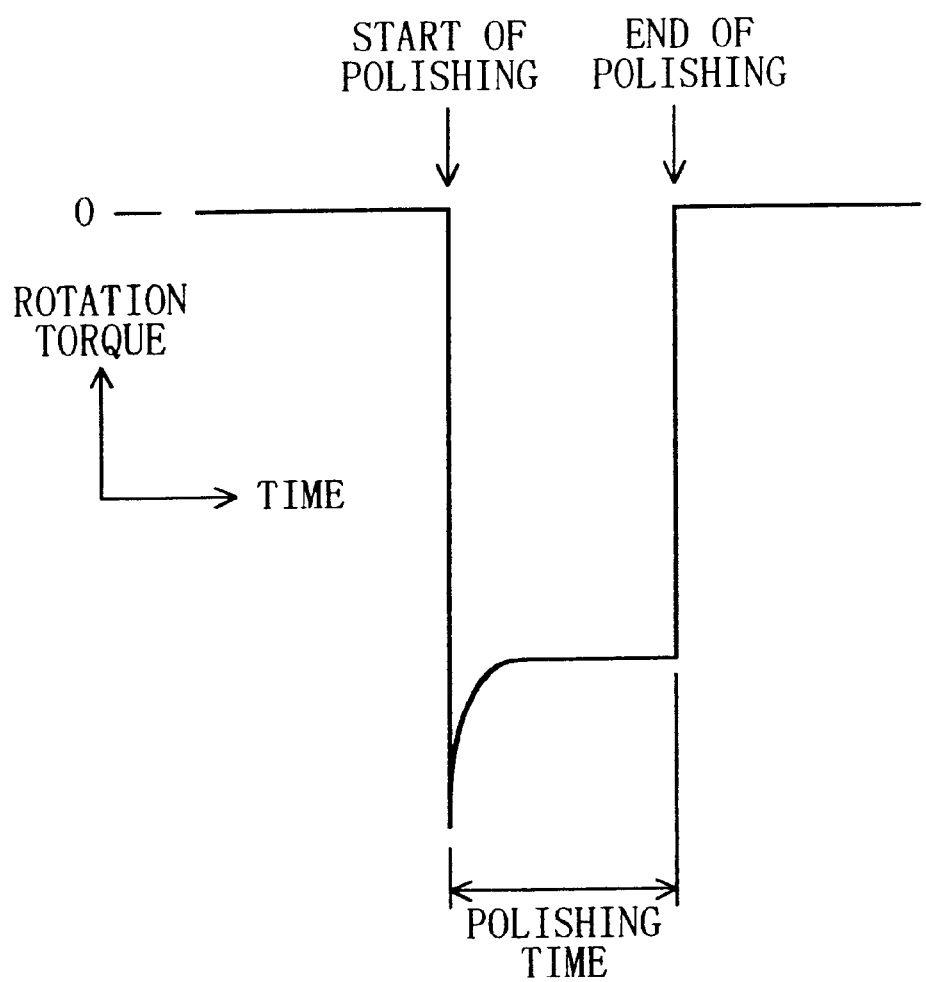
FIG. 11 is a waveform chart illustrating the solution principle of the present invention and showing the waveform of a rotation torque signal where dressing is performed on a polishing pad just before a polishing process step is performed on a substrate.
Figure 12:
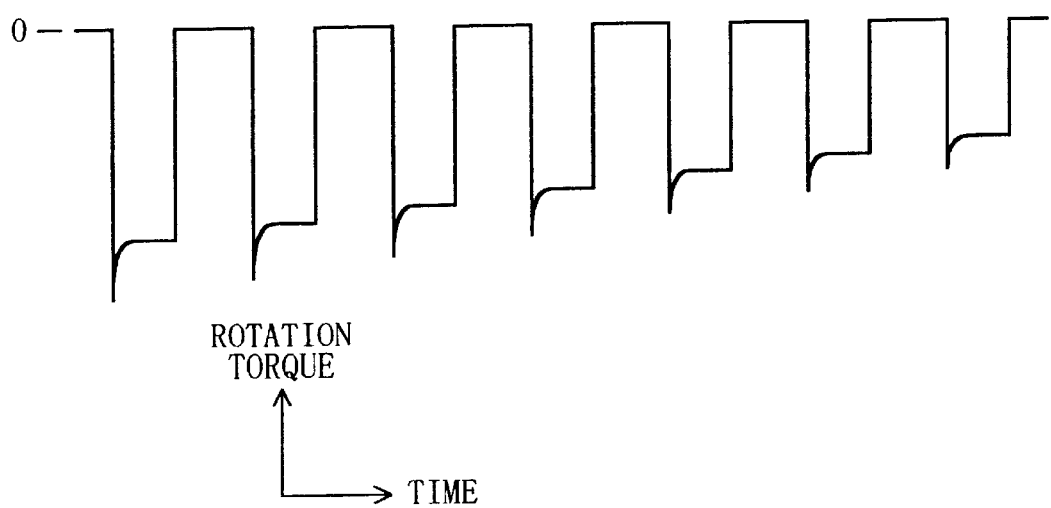
FIG. 12 is a waveform chart illustrating the solution principle of the present invention and showing the waveforms of rotation torque signals where dressing is performed on a polishing pad just before a polishing process step is performed on a substrate and then a plurality of substrates are polished one after another.
Figure 13:
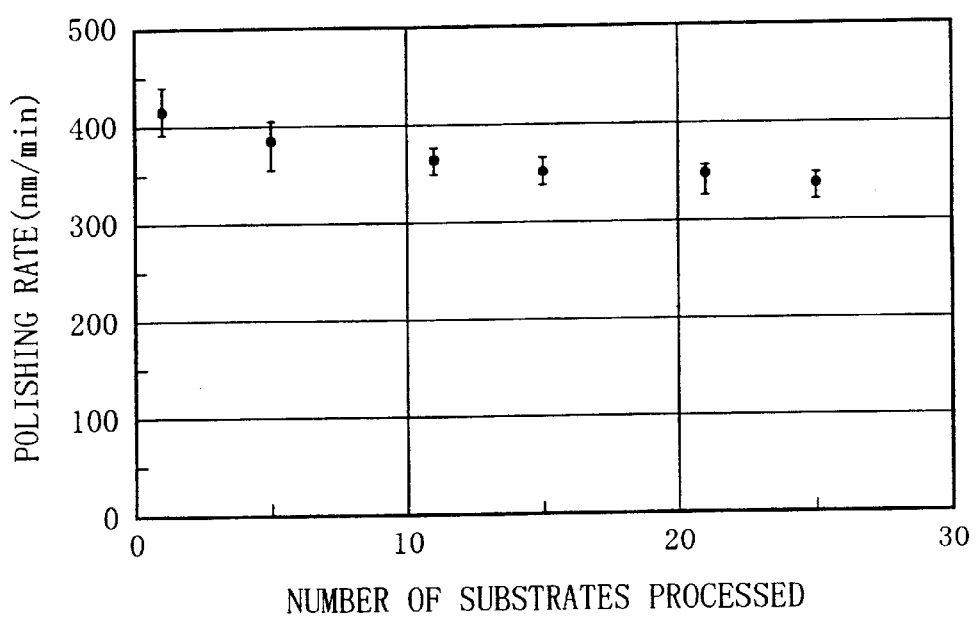
FIG. 13 is a graph illustrating the solution principle of the present invention and showing the relationship between the number of substrates processed and a polishing rate.

For example, as shown in FIG. 9, if the rotation torque $T_{Pn}$ of the polishing platen 104 during the n-th polishing process step on a substrate is smaller than the initial rotation torque $T_{P1}$, the load $G_{n+1}$ for the (n+1)th dressing process step is set larger than the load $G_n$ for the n-th dressing process step by $\Delta G'$, thereby recovering the initial state for the polishing surface of the polishing pad 103.

In the sixth embodiment, if the rotation torque of the polishing platen 104 during a polishing process step on a substrate is substantially equal to the initial rotation torque $T_{P1}$, the load for the next dressing process step is set equal to the load for the current dressing process step. On the other hand, if the rotation torque of the polishing platen 104 is smaller than the initial rotation torque $T_{P1}$, it can be seen that the polishing surface of the polishing pad 103 has got clogged. Thus, the load for the next dressing process step is set larger than the load for the current dressing process step, thereby recovering the initial state for the polishing surface of the polishing pad 103. As a result, the polishing rates among the substrates can be kept constant.

In the sixth embodiment, the processing conditions for dressing are set based on the rotation torque of the rotation axis 104a of the polishing platen 104. Alternatively, the processing conditions for dressing may be set based on the rotation torque of the substrate holder 102 or the rotation torque of the dresser 107.

In the fifth and sixth embodiments, rotation torque in the steady state where the rotation torque waveform has flattened is detected during a polishing process step. Alternatively, rotation torque immediately after a polishing process step is started, i.e., a peak value of rotation torque, may be detected instead. Such a method is particularly effective to polishing a soft film such as a BPSG film within a short period of time, i.e., a case where polishing is likely to be completed before rotation torque has settled in the steady state.

Also, in the fifth and sixth embodiments, the rotation torque during the first polishing process step performed after the polishing surface of the polishing pad 103 has recovered its initial state through initial dressing is regarded as initial rotation torque. Alternatively, rotation torque obtained beforehand by experiment or calculation may be used as preset rotation torque, and measured rotation torque may be compared to the preset rotation torque.

What is claimed is:

1. A chemical/mechanical polishing apparatus comprising:

a polishing platen mounted to be rotatable;

a polishing pad fixed on the polishing platen;

abrasive supply means for supplying an abrasive onto the polishing pad;

a substrate holder, mounted to be rotatable above the polishing pad, for holding a substrate to be polished and pressing and polishing the substrate against the polishing pad;

a dresser, mounted to be rotatable above the polishing pad, for dressing the polishing pad;

torque detection means for detecting at least one of the rotation torque of the polishing platen and the rotation torque of the substrate holder; and dresser control means for setting the processing parameters including revolving speed of the dresser, pressure of the dresser against the polishing pad, and time of contact between the dresser and the polishing pad, thereby making the dresser dress the polishing pad, if the rotation torque detected by the torque detection means is equal to or smaller than a predetermined value.

2. The apparatus of claim 1, further comprising polishing control means for obtaining a rotation torque integrated value by integrating the rotation torque detected by the torque detection means with respect to time, and for stopping the operation of pressing and polishing the substrate, held by the substrate holder, against the polishing pad when the rotation torque integrated value reaches a prescribed value.

3. A chemical/mechanical polishing apparatus comprising:

a polishing platen mounted to be rotatable;

a polishing pad fixed on the polishing platen;

abrasive supply means for supplying an abrasive onto the polishing pad;

a substrate holder, mounted to be rotatable above the polishing pad, for holding a substrate to be polished and pressing and polishing the substrate against the polishing pad;

a dresser, mounted to be rotatable above the polishing pad, for dressing the polishing pad;

torque detection means for detecting at least one of the rotation torque of the polishing platen, the rotation torque of the substrate holder and the rotation torque of the dresser; and dresser control means for increasing at least one of processing parameters including revolving speed of the dresser, pressure of the dresser against the polishing pad and amount of time during which the dresser dresses the polishing pad if the rotation torque detected by the torque detection means is smaller than a predetermined value.

4. The apparatus of claim 3, further comprising polishing control means for obtaining a rotation torque integrated value by integrating the rotation torque detected by the torque detection means with respect to time, and for stopping the operation of pressing and polishing the substrate, held by the substrate holder, against the polishing pad when the rotation torque integrated value reaches a prescribed value.

* * * * *

UNITED STATES PATENT AND TRADEMARK OFFICE
CERTIFICATE OF CORRECTION

PATENT NO.    : 6,416,617 B2
DATED         : July 9, 2002
INVENTOR(S)   : Hideaki Yoshida et al.

It is certified that error appears in the above-identified patent and that said Letters Patent is hereby corrected as shown below:

<u>Title page,</u>
Item [73], Assignee, change the name from "Matsushita Electronics Corporation" to -- Matsushita Electric Industrial Co., Ltd. --.

Item [56], References Cited, in U.S. reference "5,904,608", change the reference date from "* 5/1999  Shaffer et al......379/220" to -- 5/1999  Watanabe......451/5 --

Below U.S. reference "5,904,609", insert the following reference data
   -- 5,907,608 A   *   5/1999   Shaffer et al   379/220 --.

Signed and Sealed this

Twenty-ninth Day of April, 2003

JAMES E. ROGAN
*Director of the United States Patent and Trademark Office*